United States Patent
Joo et al.

(10) Patent No.: US 10,388,222 B2
(45) Date of Patent: Aug. 20, 2019

(54) ELECTROLUMINESCENT DISPLAY DEVICE

(71) Applicant: LG Display Co., Ltd., Seoul (KR)

(72) Inventors: Myung-O Joo, Seoul (KR); Nack-Youn Jung, Seoul (KR); Jun-Ho Youn, Seoul (KR); Jeong-Mook Choi, Goyang-si (KR); Jun-Young Kim, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/832,632

(22) Filed: Dec. 5, 2017

(65) Prior Publication Data

US 2018/0174515 A1 Jun. 21, 2018

(30) Foreign Application Priority Data

Dec. 16, 2016 (KR) .................. 10-2016-0172975

(51) Int. Cl.
| | |
|---|---|
| *H01L 27/32* | (2006.01) |
| *H01L 51/00* | (2006.01) |
| *H01L 51/52* | (2006.01) |
| *H05B 33/10* | (2006.01) |
| *G09G 3/3233* | (2016.01) |

(52) U.S. Cl.
CPC ....... *G09G 3/3233* (2013.01); *H01L 27/3246* (2013.01); *H01L 27/3262* (2013.01); *H01L 27/3283* (2013.01); *H01L 51/0003* (2013.01); *H01L 51/5203* (2013.01); *H01L 51/5262* (2013.01); *H05B 33/10* (2013.01); *H01L 27/326* (2013.01)

(58) Field of Classification Search
None
See application file for complete search history.

(56) References Cited

U.S. PATENT DOCUMENTS

| | | | |
|---|---|---|---|
| 7,888,867 B2 | 2/2011 | Yoshida et al. | |
| 9,171,640 B2* | 10/2015 | Miyake | G09G 3/3266 |
| 9,257,082 B2 | 2/2016 | Kimura et al. | |
| 9,305,481 B2* | 4/2016 | Koyama | G02F 1/1345 |
| 10,079,272 B2 | 9/2018 | Song et al. | |
| 2002/0093209 A1 | 7/2002 | Gerchow et al. | |
| 2010/0213827 A1 | 8/2010 | Yoshida et al. | |

(Continued)

FOREIGN PATENT DOCUMENTS

| | | |
|---|---|---|
| CN | 105140236 A | 12/2015 |
| JP | 2006-0228648 A | 8/2006 |

(Continued)

OTHER PUBLICATIONS

European Search Report for European Patent Application No. EP 17207203.5 dated May 4, 2018, 8 Pages.

(Continued)

*Primary Examiner* — Crystal L Hammond
(74) *Attorney, Agent, or Firm* — Fenwick & West LLP

(57) ABSTRACT

An electroluminescent display device includes first and second pixels arranged along a first direction on a substrate; a first groove positioned at a side of the first and second pixels and including a first portion extending along the first direction and a second portion corresponding to a space between the first and second pixels; and a light emitting diode in each of the first and second pixels.

22 Claims, 8 Drawing Sheets

(56) References Cited

U.S. PATENT DOCUMENTS

| | | | |
|---|---|---|---|
| 2013/0099221 A1* | 4/2013 | Kawamura | H01L 27/3246 257/40 |
| 2014/0175469 A1* | 6/2014 | Dozen | H01L 33/005 257/89 |
| 2016/0079322 A1 | 3/2016 | Kim et al. | |
| 2016/0155859 A1 | 6/2016 | Kimura et al. | |
| 2016/0190213 A1* | 6/2016 | Kim | H01L 27/326 257/40 |
| 2016/0268352 A1* | 9/2016 | Hong | H01L 27/3218 |
| 2016/0295685 A1 | 10/2016 | Ryu et al. | |
| 2016/0351632 A1 | 12/2016 | Iguchi et al. | |
| 2016/0365396 A1* | 12/2016 | Jiao | H01L 27/3246 |
| 2017/0213878 A1 | 7/2017 | Song et al. | |
| 2018/0040677 A1 | 2/2018 | Hong et al. | |
| 2018/0138255 A1* | 5/2018 | Lee | H01L 51/0005 |

FOREIGN PATENT DOCUMENTS

| | | |
|---|---|---|
| JP | 2010-073700 A | 4/2010 |
| KR | 10-2015-0017612 A | 2/2015 |
| TW | 201629946 A | 8/2016 |
| TW | M527104 U | 8/2016 |
| TW | 201637194 A | 10/2016 |
| TW | 201640466 A | 11/2016 |
| WO | WO 2011-049224 A1 | 4/2011 |

OTHER PUBLICATIONS

Japan Patent Office, Notification of Reasons for Refusal, JP Patent Application No. 2017-233926, dated Nov. 27, 2018, 11 pages.
Taiwan Intellectual Property Office, First Office Action, TW Patent Application No. 106139748, dated Jun. 7, 2018, seven pages.

* cited by examiner

ELECTROLUMINESCENT DISPLAY DEVICE

CROSS-REFERENCE TO RELATED APPLICATION

The present application claims the benefit of Republic of Korea Patent Application No. 10-2016-0172975 filed on Dec. 16, 2016, which is hereby incorporated by reference.

BACKGROUND

Field of Technology

The present disclosure relates to a display device, and more particularly, to an electroluminescent display device having emitting layers of uniform thickness.

Discussion of the Related Art

An electroluminescent display device as new flat panel display is a self-emission type without a backlight unit. Accordingly, in comparison to other display device, e.g., a liquid crystal display device, the electroluminescent display device has advantages in the viewing angle, the contrast ratio, the thin profile, the light weight and the power consumption. In addition, the electroluminescent display device can be driven by a low DC voltage and has fast response time. Moreover, the electroluminescent display device has more impact-resistance and low production costs.

FIG. 1 is a schematic cross-sectional view of the related art electroluminescent display device. As shown in FIG. 1, the related art electroluminescent display device 1 includes a substrate 10 including a pixel region, a driving TFT Td on or over the substrate 10 and a light emitting diode D connected to the TFT Td. The substrate 10 may be a glass substrate or a plastic substrate. A semiconductor layer 20 is formed on the substrate 10. The semiconductor layer 20 may be formed of an oxide semiconductor material or a polysilicon. A gate insulating layer 26 is formed on the semiconductor layer 20. The gate insulating layer 26 may be formed of an inorganic insulating material such as silicon oxide or silicon nitride. A gate electrode 30, which is formed of a conductive material, e.g., metal, is formed on the gate insulating layer 26 to correspond to a center of the semiconductor layer 20. An interlayer insulating layer 36, which is formed of an insulating material, is formed on an entire surface of the substrate 10. The interlayer insulating layer 36 may be formed of an inorganic insulating material, e.g., silicon oxide or silicon nitride, or an organic insulating material, e.g., benzocyclobutene or photo-acryl. The interlayer insulating layer 36 includes first and second contact holes 37 and 38 exposing both sides of the semiconductor layer 20. The first and second contact holes 37 and 38 are positioned at both sides of the gate electrode 30 to be spaced apart from the gate electrode 30.

A source electrode 40 and a drain electrode 42, which are formed of a conductive material, e.g., metal, are formed on the interlayer insulating layer 36. The source electrode 40 and the drain electrode 42 are spaced apart from each other with respect to the gate electrode 30 and respectively contact both sides of the semiconductor layer 20 through the first and second contact holes 37 and 38. The semiconductor layer 20, the gate electrode 30, the source electrode 40 and the drain electrode 42 constitute the driving TFT Td.

Although not shown, a gate line and a data line are disposed on or over the substrate 10 and cross each other to define a pixel region. In addition, a switching element, which is electrically connected to the gate line and the data line, and a power line, which is parallel to and spaced apart from the gate line or the data line, may be disposed on or over the substrate 10. The switching element is electrically connected to the TFT Tr as the driving element. Moreover, a storage capacitor for maintaining a voltage of the gate electrode 30 of the TFT Tr during one frame may be further formed on the substrate 10. A passivation layer 50, which includes a drain contact hole 52 exposing the drain electrode 42 of the driving TFT Td, is formed to cover the driving TFT Td. A first electrode 60, which is connected to the drain electrode 42 of the driving TFT Td through the drain contact hole 52, is separately formed on the passivation layer 50. In addition, a bank layer 70, which has an opening for exposing a center of the first electrode 60 and covers an edge of the first electrode 60, is formed on the passivation layer 50. An emitting layer 62 and a second electrode 64 are sequentially formed on the first electrode 60. The first electrode 60, the second electrode 64 facing the first electrode 60 and the emitting layer 62 therebetween constitute the light emitting diode D.

Generally, the emitting layer 62 is formed by a thermal depositing process. However, there is a limitation in the thermal deposition for the emitting layer 62 of a large-size display device. Hence, an alternative process of using a solution and then vaporizing the solution to solidify the emitting layer 62, known as, a solution process may be used.

However, when the emitting layer 62 is formed by the solution process, the thickness in the emitting layer of pixel regions may be become inconsistent at different pixels, decreasing the quality and the lifetime of the electroluminescent display device.

SUMMARY

Embodiments relate to an electroluminescent display device including a first pixel, a second pixel, a third pixel, and at least one indent. The first pixel is on a substrate. The second pixel is on the substrate and separated from the first pixel in a first direction. The third pixel is on the substrate and separated from the first pixel in a second direction. At least one indent is between the first pixel and the third pixel. Edge distances from the at least one indent to the first, second and third pixels are same.

In one or more embodiments, the second pixel is separated from the first pixel in the first direction by a first edge distance. The third pixel is separated from the first pixel in the second direction by the second edge distance larger than the first edge distance.

In one or more embodiments, the indent has a different width along a length of the indent.

In one or more embodiments, the indent has a first width between the first pixel and the second pixel, and the indent has a second width between the first pixel and the third pixel, the second width narrower than the first width.

In one or more embodiments, the edge distances are equal to an edge distance between the first pixel and the second pixel.

In one or more embodiments, at least one indent includes a first indent and a second indent between the first pixel and the third pixel, the first indent closer to the first pixel than the third pixel, the second indent closer to the third pixel than the first pixel. The edge distance between the first indent and the first pixel is same as an edge distance between the second indent and the third pixel.

In one or more embodiments, the first pixel and the second pixel are in a same row of pixels arranged in the first direction, and the third pixel is in a same column of pixels arranged in the second direction.

In one or more embodiments, the second direction is perpendicular to the first direction.

In one or more embodiments, the first, the second and the third pixels have round edges.

In one or more embodiments, the at least one indent comprises a first groove and a second groove, the first groove having a first linear bar portion extending alongside a row of pixels and first bump portions protruding towards gaps between the row of pixels, and the second groove having a second linear bar portion extending parallel to the first linear bar portion and having second bump portions protruding towards gaps between another row of pixels including the third pixel.

In one or more embodiments, an edge distance between an edge of the first pixel and a first bump portion nearest to the edge of the first pixel is same as an edge distance between an end of the first pixel and the first linear bar portion, and wherein an edge distance between an edge of the third pixel and a second bump portion nearest to the edge of the third pixel is same as an edge distance between an end of the third pixel and the second linear bar portion.

In one or more embodiments, at least one groove or hole comprises a linear bar portion extending alongside a row of pixels, first bump portions protruding towards gaps between the row of pixels, and second bump portions protruding towards gaps between another row of pixels including the third pixel.

In one or more embodiments, an edge distance between the first pixel and a nearest first portion is same as an edge distance between the first pixel and the linear bar portion.

In one or more embodiments, the at least one indent comprises a first linear bar portion extending alongside a row of pixels, first holes between the first linear bar portion and the row of pixels, second linear bar portion extending parallel to the first linear bar portion, and second holes between the second linear bar portion and another row of pixels including the third pixel.

In one or more embodiments, an edge distance from an edge of the first pixel to a nearest first hole is same as an edge distance from an end of the first pixel to the first linear bar portion, and an edge distance from an edge of the third pixel to a nearest second hole is same as an edge distance from an end of the third pixel to the second linear bar portion.

In one or more embodiments, the at least one groove or hole comprises a linear bar portion extending alongside a row of pixels, first holes between the linear bar portion and the row of pixels, and second holes between the linear bar portion and another row of pixels including the third pixel.

In one or more embodiments, an edge distance between the first pixel and a nearest first hole is same as an edge distance between the first pixel and the linear bar portion, and an edge distance between the third pixel and a nearest second hole is same as an edge distance from the third pixel to the linear bar portion.

In one or more embodiments, the electroluminescent display device further includes a bank layer defining the first pixel, the second pixel and the third pixel; and an electrode covering the bank layer, the electrode forming a bottom of the at least one indent.

In one or more embodiments, each of the first, second and third pixels comprises a driving transistor, a portion of a layer on or above the driving transistor, a first electrode connected to a terminal of the driving transistor, an emitting layer on the first electrode, and a second electrode on the emitting layer, the second electrode extending over a bank layer and the at least one indent, wherein the at least one indent is filled with solidified emitting material.

In one or more embodiments, the solidified emitting material in the at least one groove or hole is not connected to the first electrode but connected to the second electrode.

In one or more embodiments, the layer on or above the driving transistor is a passivation layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

As mentioned above, when the emitting layer is formed by the solution process, the thickness deviation problem of the emitting layer is generated. The reason of the thickness deviation problem may be a difference in a solvent concentration in the air according to a position of the pixel region. It is explained in more detail.

A pixel described herein may include multiple sub-pixels or consist of a sub-pixel.

An edge distance of two objects described herein refers to a distance between closest edges of the two objects.

Figure 1:
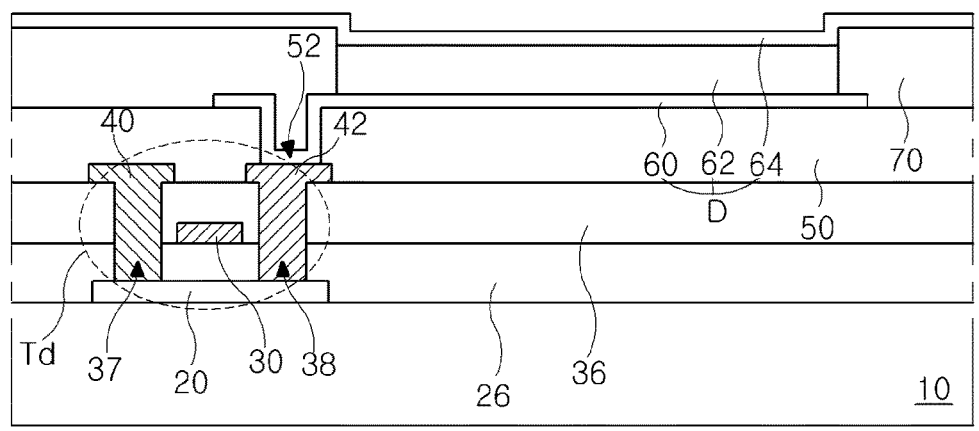
FIG. 1 is a schematic cross-sectional view of the related art electroluminescent display device.
Figure 2:
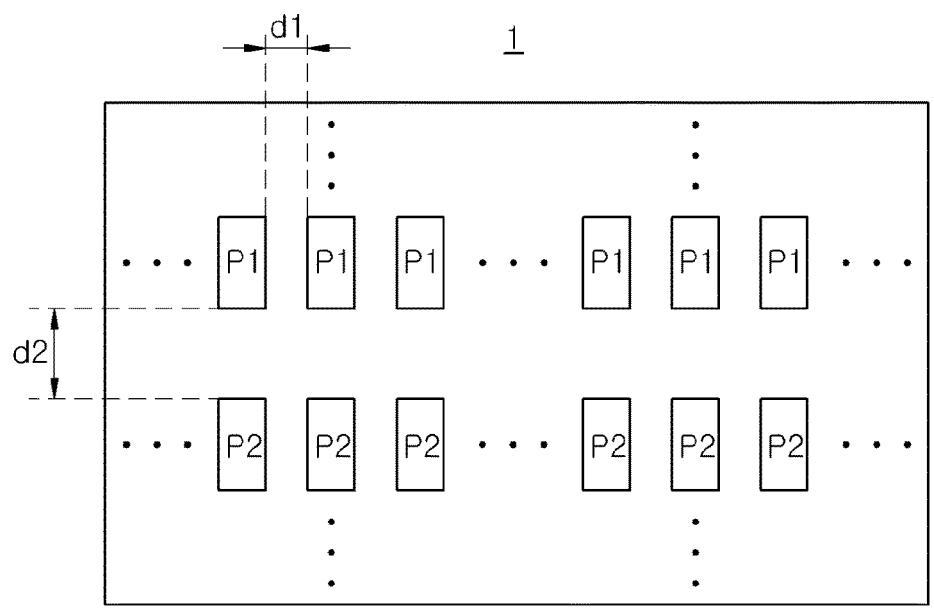
FIG. 2 is a schematic view illustrating a thickness non-uniformity problem in the emitting layer.

FIG. 2 is a schematic view illustrating a thickness non-uniformity problem in the emitting layer. In the electroluminescent display device 1, a plurality of first pixels P1 and a plurality of second pixels P2 are arranged. The first pixels P1 are arranged in a first row along a first direction (e.g., horizontally), and the second pixels P2 are arranged in a second row. The second pixels P2 are spaced apart from the first pixels P1 in a second direction (e.g., vertically) being perpendicular to the first direction.

Adjacent two of the first pixels P1 and adjacent two of the second pixels P2 are spaced apart from each other by a first edge distance d1, and the first pixel P1 and the second pixel P2 are spaced apart from each other by a second edge distance d2 that is greater than the first edge distance d1.

In the solution process for forming the emitting layer of the light emitting diode, emitting material solution is first coated, and then the solvent in the emitting material solution is evaporated, for example, in a vacuum chamber. In this instance, before loading the substrate coated with the emitting material solution onto the vacuum chamber, the solvent in the emitting material solution is spontaneously evaporated. In the spontaneous evaporation, a solvent concentration in a space between adjacent first pixels P1 or adjacent second pixels P2 becomes different from that in a space between adjacent first and second pixels P1 and P2. That is, compared to ends of the first pixel P1 or the second pixel P2 in the first direction, the solvent is more rapidly evaporated in ends of the first and second pixels P1 and P2 in the second direction. As a result, the emitting layer has a thickness non-uniformity in each pixel region along the first and second directions.

Figure 3:
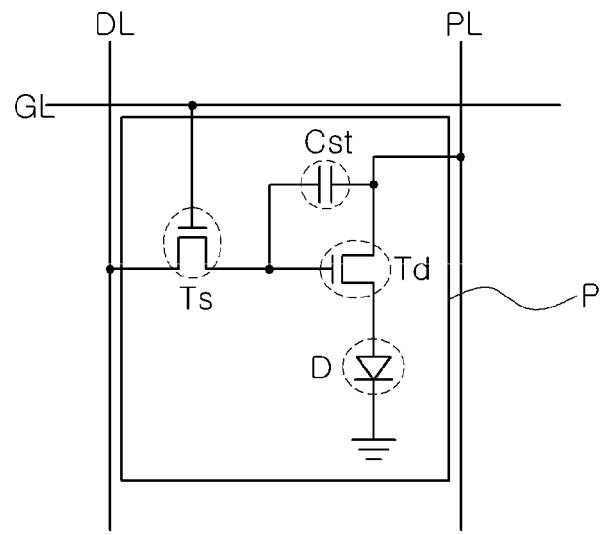
FIG. 3 is a circuit diagram of one pixel region of an electroluminescent display device of the present invention.

FIG. 3 is a circuit diagram of one pixel region of an electroluminescent display device, according to one embodiment. As shown in FIG. 3, in an electroluminescent display device, a gate line GL and a data line DL are formed. The gate line GL and the data line DL cross each other to define a pixel region P. In addition, a switching thin film transistor (TFT) Ts, a driving TFT Td, a storage capacitor Cst and a light emitting diode D are provided in the pixel region.

The switching TFT Ts is connected to the gate line GL and the data line DL, and the driving TFT Td and the storage capacitor Cst are respectively connected to the switching TFT Ts and the power line PL. The light emitting diode D is connected to the driving TFT Td.

In the electroluminescent display device, when the switching TFT Ts is turned on by a gate signal applied through the gate line GL, a data signal from the data line DL is applied to a gate electrode of the driving TFT Td and an electrode of the storage capacitor Cst through the switching TFT Ts.

When the driving TFT Td is turned on by the data signal, an electric current is supplied to the light emitting diode D from the high voltage supply VDD through the driving TFT Td. As a result, the light emitting diode D emits light. Since the current in the light emitting diode D is proportional to the data signal and the light intensity emitted from the light emitting diode D is proportional to the current in the light emitting diode D, the pixel region P provide a gray scale according to the data signal.

The storage capacitor Cst serves to maintain the voltage of the gate electrode of the driving TFT Td for one frame. Accordingly, the electroluminescent display device displays a consistent images during the frame.

Figure 4:
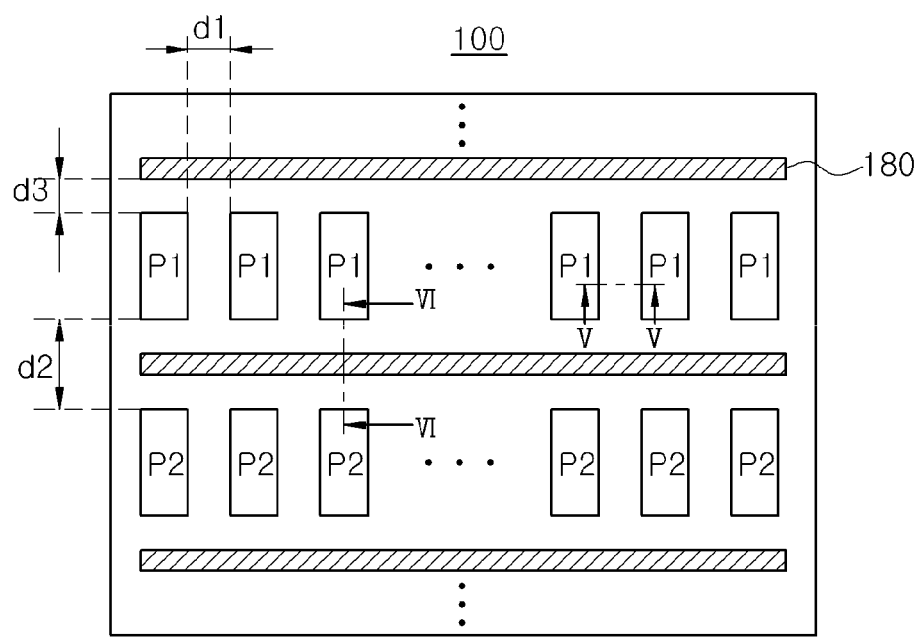
FIG. 4 is a schematic plane view of an electroluminescent display device according to a first embodiment of the present invention.

FIG. 4 is a schematic plane view of an electroluminescent display device according to a first embodiment of the present invention. As shown in FIG. 4, in an electroluminescent display device 100, a plurality of first pixels P1, a plurality of second pixels P2 and a groove (or an indent) 180 are arranged. The first pixels P1 are arranged in a first row along the first direction, and the second pixels P2 are arranged in a second row. The second pixels P2 are spaced apart from the first pixels P1 in the second direction perpendicular to the first direction. The groove 180 extends along the first direction and is positioned between the first pixels P1 in the first row and the second pixels P2 in the second row.

Although not shown, a light emitting diode is positioned in each of the first and second pixels P1 and P2. The light emitting diode may include a first electrode, a second electrode facing the first electrode and an emitting layer therebetween. In addition, a driving TFT connected to the light emitting diode is positioned in each of the first and second pixels P1 and P2.

Two adjacent first pixels P1 and two adjacent second pixels P2 are spaced apart from each other by a first edge distance d1, and the first pixel P1 and the adjacent second pixel P2 are spaced apart from each other by a second edge distance d2 that is greater than the first edge distance d1. The groove 180 is spaced apart from the first and second pixels P1 and P2 by a third edge distance d3 substantially equal to the first edge distance d1.

The groove 180 is positioned between a first horizontal pixel row, where the first pixels P1 are arranged, and a second horizontal pixel row, where the second pixels P2 are arranged. The groove 180 is separated by the third edge distance d3 from each of the first and second pixels P1 and P2 (or the first and second horizontal pixel rows). The groove 180 may be bar shaped which is parallel to the first and second horizontal pixel rows, but it is not limited thereto. The bar shape of the groove 180 is advantageous, among other reasons, because a fabrication process associated with the formation of the groove can be simplified.

When the emitting layer of the light emitting diode is formed by a coating process using the solution in a liquid phase, an emitting material solution including a solvent or only solvent is coated (or dropped) into the groove 180 such that the thickness non-uniformity problem of the emitting layer caused by the deviation of a solvent evaporation in the solution process is prevented.

Namely, since the second edge distance d2 between the first pixel P1 and second pixel P2, which are vertically adjacent in a vertical pixel column, is greater than the first edge distance d1 between adjacent first pixels P1 or between adjacent second pixels P2, which are horizontally adjacent in a horizontal pixel row, the thickness deviation of the emitting layer may be generated at a horizontal edge and a vertical edge of each of the first and second pixels P1 and P2 without the groove 180.

However, in the electroluminescent display device of the embodiment, since the groove where the emitting material solution or the solvent is coated is formed between the first pixel P1 and the second pixel P2 with the third edge distance d3, which is substantially equal to the first edge distance d1 from the first and second pixels P1 and P2. This enhances the thickness uniformity of the emitting layer at the horizontal ends and the vertical ends of each pixel P1 and P2. Accordingly, the display quality is improved and the deterioration of lifespan of the electroluminescent display device resulting from the thickness non-uniformity of the emitting material is prevented.

Figure 5:
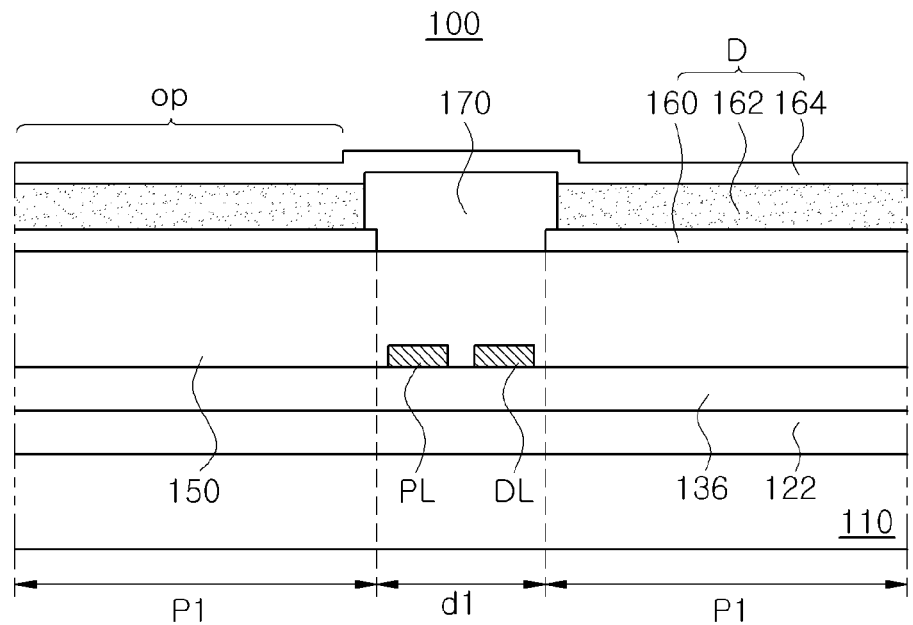
FIG. 5 is a cross-sectional view of the electroluminescent display device taken along the line V-V of FIG. 4.
Figure 6:
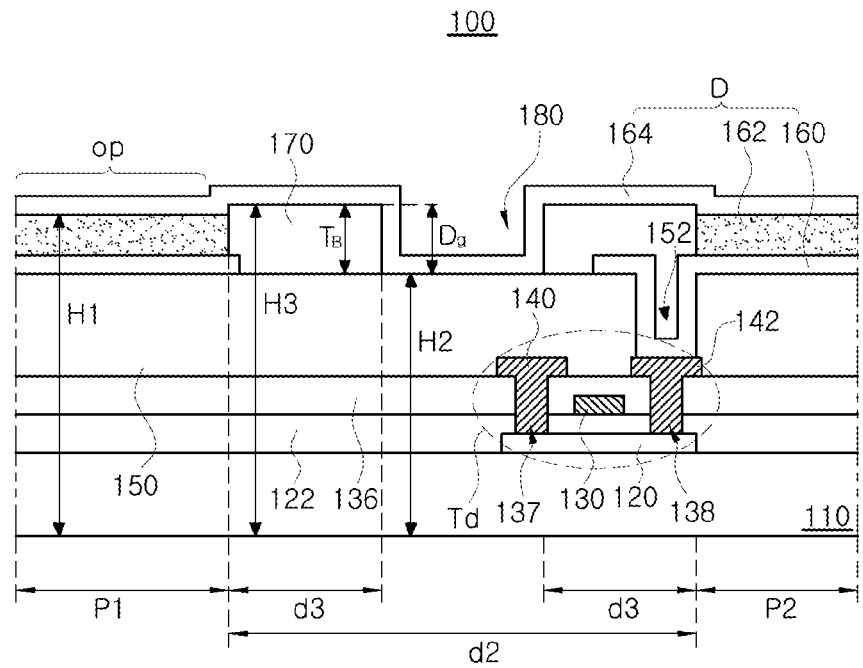
FIG. 6 is a cross-sectional view of the electroluminescent display device taken along the line VI-VI of FIG. 4.

FIG. 5 is a cross-sectional view taken along the line V-V of FIG. 4, and FIG. 6 is a cross-sectional view taken along the line VI-VI of FIG. 4. As shown in FIGS. 5 and 6, the electroluminescent display device 100 according to the first embodiment of the present invention includes a substrate 110, where the first pixels P1 adjacent along the first direction and the second pixels P2 adjacent to the first pixel P1 along the second direction are defined, the driving TFT Td on or over the substrate 110, the light emitting diode D connected to the driving TFT Td and the groove 180 along the first direction and between the first and second pixels P1 and P2.

On the substrate 110, the gate lines GL (of FIG. 3) extend along either the first direction or the second direction, the data lines DL extend along a direction perpendicular to the direction along with the gated lines GL extend, the switching TFT Ts (of FIG. 3) and each of the power lines PL may be formed parallel to and spaced apart from a corresponding data line DL. Alternatively, the power line PL may be parallel to and spaced apart from the gate line GL. The gate lines GL and the data lines DL cross each other to define the first and second pixels P1 and P2, and the driving TFT Td is connected to the switching TFT Ts. In addition, the storage capacitor Cst may be formed in each of the first and second pixels P1 and P2. The substrate 110 may be a glass substrate or a plastic substrate. A semiconductor layer 120 is formed on the substrate 110. The semiconductor layer 120 may be formed of an oxide semiconductor material or a poly-silicon.

When the semiconductor layer 120 includes the oxide semiconductor material, a light-shielding pattern (not shown) may be formed under the semiconductor layer 120. The light to the semiconductor layer 120 is shielded or blocked by the light-shielding pattern such that thermal degradation of the semiconductor layer 120 can be prevented. On the other hand, when the semiconductor layer 120 includes polycrystalline silicon, impurities may be doped into both sides of the semiconductor layer 120.

A gate insulating layer 122 is formed on the semiconductor layer 120. The gate insulating layer 122 may be formed of an inorganic insulating material such as silicon oxide or silicon nitride. A gate electrode 130, which is formed of a conductive material, e.g., metal, is formed on the gate insulating layer 122 to correspond to a center of the semiconductor layer 120. In addition, the gate line GL and a first capacitor electrode (not shown) of the storage capacitor Cst may be formed on the gate insulating layer 122. The gate line GL may extend along the first direction, and the first capacitor electrode may be connected to the gate electrode 130.

In FIG. 6, the gate insulating layer 122 is formed across the entire surface of the substrate 110. Alternatively, the gate insulating layer 122 may be patterned to have the same shape as the gate electrode 130. An interlayer insulating layer 136 formed of an insulating material is formed across an entire surface of the substrate 110 including the gate electrode 130. The interlayer insulating layer 136 may be formed of an inorganic insulating material, e.g., silicon oxide or silicon nitride, or an organic insulating material, e.g., benzocyclobutene or photo-acryl.

The interlayer insulating layer 136 includes first and second contact holes 137 and 138 exposing both sides of the semiconductor layer 120. The first and second contact holes 137 and 138 are positioned at both sides of the gate electrode 130 to be spaced apart from the gate electrode 130.

In FIG. 6, the first and second contact holes 137 and 138 extend into the gate insulating layer 122. Alternatively, when the gate insulating layer 122 is patterned to have the same shape as the gate electrode 130, the first and second contact holes 137 and 138 may be formed in the interlayer insulating layer 136 except the gate insulating layer 122.

A source electrode 140 and a drain electrode 142, which are formed of a conductive material, e.g., metal, are formed on the interlayer insulating layer 136. In addition, the data line DL extends along the second direction. The power line PL and a second capacitor electrode (not shown) of the storage capacitor Cst may be formed on the interlayer insulating layer 136. The source electrode 140 and the drain electrode 142 are spaced apart from each other with respect to the gate electrode 130 and respectively contact both sides of the semiconductor layer 120 through the first and second contact holes 137 and 138.

The data line DL crosses the gate line GL to define the first and second pixels P1 and P2, and the power line PL is spaced apart from the data line DL. Alternatively, the power line PL may be formed on the same layer as the gate line GL to be spaced apart from the gate line GL and cross the data line DL.

The second capacitor electrode may be connected to the source electrode 140 and overlap the first capacitor electrode such that the first capacitor electrode, the second capacitor electrode and the interlayer insulating layer 136 therebetween constitute the storage capacitor Cst.

The semiconductor layer 120, the gate electrode 130, the source electrode 140 and the drain electrode 142 constitute the driving TFT Td. The gate electrode 130, the source electrode 140 and the drain electrode 142 are positioned over the semiconductor layer 120. Namely, the TFT Td has a coplanar structure. Alternatively, in the TFT Td, the gate electrode may be positioned under the semiconductor layer, and the source and drain electrodes may be positioned over the semiconductor layer such that the TFT Td may have an inverted staggered structure. In this instance, the semiconductor layer may include amorphous silicon.

As mentioned above, the switching TFT Ts may be disposed on the substrate 110. The switching element may have substantially same structure as the driving TFT Td. The gate electrode of the driving TFT Td is connected to a drain electrode of the switching TFT Ts, and the source electrode 140 of the driving TFT Td is connected to the power line PL. In addition, the gate electrode and the source electrode of the switching TFT Ts are connected to the gate line GL and the data line DL, respectively.

A passivation layer 150, which includes a drain contact hole 152 exposing the drain electrode 142 of the driving TFT Td, is formed to cover the driving TFT Td.

A first electrode 160, which is connected to the drain electrode 142 of the driving TFT Td through the drain contact hole 152, is separately formed on the passivation layer 150 in each of the first and second pixels P1 and P2. The first electrode 160 may be an anode and may be formed of a conductive material having a relatively high work function. For example, the first electrode 160 may be formed of a transparent conductive material such as indium-tin-oxide (ITO) or indium-zinc-oxide (IZO).

When the electroluminescent display device 100 of the present invention is a top-emission type, a reflection electrode or a reflection layer may be formed under the first electrode 160. For example, the reflection electrode or the reflection layer may be formed of aluminum-palladium-copper (APC) alloy.

A bank layer 170, which covers edges of the first electrode 160, is formed on the passivation layer 150. The bank layer 170 has an opening OP corresponding to each of the first and second pixels P1 and P2 and the groove 180 between the first pixel P1 and the second pixel P2. The bank layer 170 surrounds and defines each of the first and second pixels P1 and P2, and an area of each of the first and second pixels P1 and P2 may correspond to an area of the opening OP or an area of the emitting layer 162 in the opening OP.

A center of the first electrode 160 is exposed through the opening OP, and the passivation layer 150 is exposed through the groove 180.

The groove 180 has a depth Dg that is substantially equal to a thickness TB of the bank layer 170. Alternatively, the groove 180 may be formed by removing a part of the bank layer 170 such that the depth of the groove 180 may be smaller than the thickness of the bank layer 170. In addition, the groove 180 may be formed by removing the bank layer 170 and partially or completely removing the passivation layer 150 such that the depth of the groove 180 may be greater than the thickness of the bank layer 170.

An emitting layer 162 is formed on the first electrode 160. The emitting layer 162 may be formed by a solution process using a liquid phase emitting material. Namely, an emitting material solution with a solvent is coated and dried such that the emitting layer 162 is formed. For example, the solution process may be an inkjet coating process, a slit coating process, a spin coating process, a printing process or a drop coating process, but it is not limited thereto.

The emitting layer 162 may have a single-layered structure of an emitting material layer. Alternatively, to improve emitting efficiency, the emitting layer 162 may further include a hole injection layer and a hole transporting layer, which are sequentially stacked between the first electrode 160 and the emitting material layer, and an electron transporting layer and an electron injection layer sequentially between the emitting material layer and the second electrode 164.

The emitting material layer may include an inorganic emitting material, e.g., a quantum dot, or an organic emitting material. The electroluminescent display device 100 of the present invention may be an organic light emitting display device (OLED) or a quantum dot light emitting display device (QLED).

After the solvent included in the emitting material solution for the emitting material layer is coated in the groove 180, the solvent is dried and evaporated. As a result, after the emitting layer 162 is formed, there is no layer in the groove 180 such that the passivation layer 150 may be exposed through the groove 180. Alternatively, when the emitting material solution is coated in the groove 180, an auxiliary material pattern may be formed in the groove 180 and on the passivation layer 150. The auxiliary material pattern described herein refers to solidified light emitting material remaining after solvents are vaporized.

In the electroluminescent display device 100, solvent is coated in the groove 180 positioned between the first and second pixels P1 and P2. Hence, despite the second edge distance d2 between the first and second pixels P1 and P2 being greater than the first edge distance d1 between adjacent pixels P1, P2 between the same row, the solvent concentration in the surrounding air the first and second pixels P1 and P2 becomes uniform at different locations. As a result, the non-uniformity of thickness in the emitting layer 162 resulting from a difference in an edge distance between horizontally adjacent pixels and an edge distance between vertically adjacent pixels is prevented or reduced.

A second electrode 164 is formed over the substrate 110 including the emitting layer 162. The second electrode 164 may be formed across an entire surface of the display area. The second electrode 164 may be a cathode and may be formed of a conductive material having a relatively low work function. For example, the second electrode 164 may be formed of aluminum (Al), magnesium (Mg) or Al—Mg alloy.

In the top-emission type electroluminescent display device 100, the second electrode 164 may have a thin thickness such that the light from the emitting layer 162 may be transmitted through the second electrode 164. On the other hand, in the bottom-emission type electroluminescent display device 100, the second electrode 164 may serve as a reflection electrode.

The second electrode 164 contacts the emitting layer 162 in each of the first and second pixels P1 and P2 and the passivation layer 150 in the groove 180 between the first and second pixels P1 and P2. In addition, the second electrode 164 between adjacent first pixels P1 and between adjacent second pixels P2 may contact the bank layer 170.

From the substrate 110, the second electrode 164 has a first height $H_1$ in each of the first and second pixels P1 and P2, and a second height H2 in the groove 180. The second height H2 is shorter than the first height $H_1$. In addition, from the substrate 110, the second electrode 164 has a third height $H_3$, which is greater than the first height $H_1$, in a portion between adjacent first pixels P1 and/or between adjacent second pixels P2.

When the auxiliary material pattern is formed in the groove 180, the second electrode 164 in the groove 180 contacts the auxiliary material pattern. In this instance, since the auxiliary material pattern does not contact the first electrode 160, there is no emission from the auxiliary material pattern in the groove 180. The first electrode 160, the second electrode 164 facing the first electrode 160 and the emitting layer 162 therebetween constitute the light emitting diode D.

Although not shown, an encapsulation film or an encapsulation substrate may be formed on or over the light emitting diode D to prevent penetration of moisture into the light emitting diode D and protect the light emitting diode D. For example, the encapsulation film may include a first inorganic layer, an organic layer and a second inorganic layer sequentially stacked. In addition, a polarization plate may be disposed or attached on the encapsulation film to prevent or minimize an ambient light reflection. For example, the polarization plate may be a circular polarization plate.

In the electroluminescent display device 100 of the present invention, since the emitting layer 162 is formed by the solution process, the fabrication process is simplified and a large-sized display device can be fabricated.

In addition, since the solvent or the emitting material solution is coated in the groove 180 between the first and second pixels P1 and P2, which are spaced apart from each other by a relatively large edge distance, the thickness non-uniformity problem of the emitting layer 162 resulting from the solution process is prevented or minimized. Accordingly, the decrease problem of the display quality and the lifetime by the thickness non-uniformity of the emitting layer 162 is prevented or reduced.

However, in the electroluminescent display device 100 according to the first embodiment of the present invention, there may be still a thickness non-uniformity problem at a corner of the first and second pixels P1 and P2. An electroluminescent display device relieving or preventing this issue is described below with reference to FIG. 7.

Figure 7:
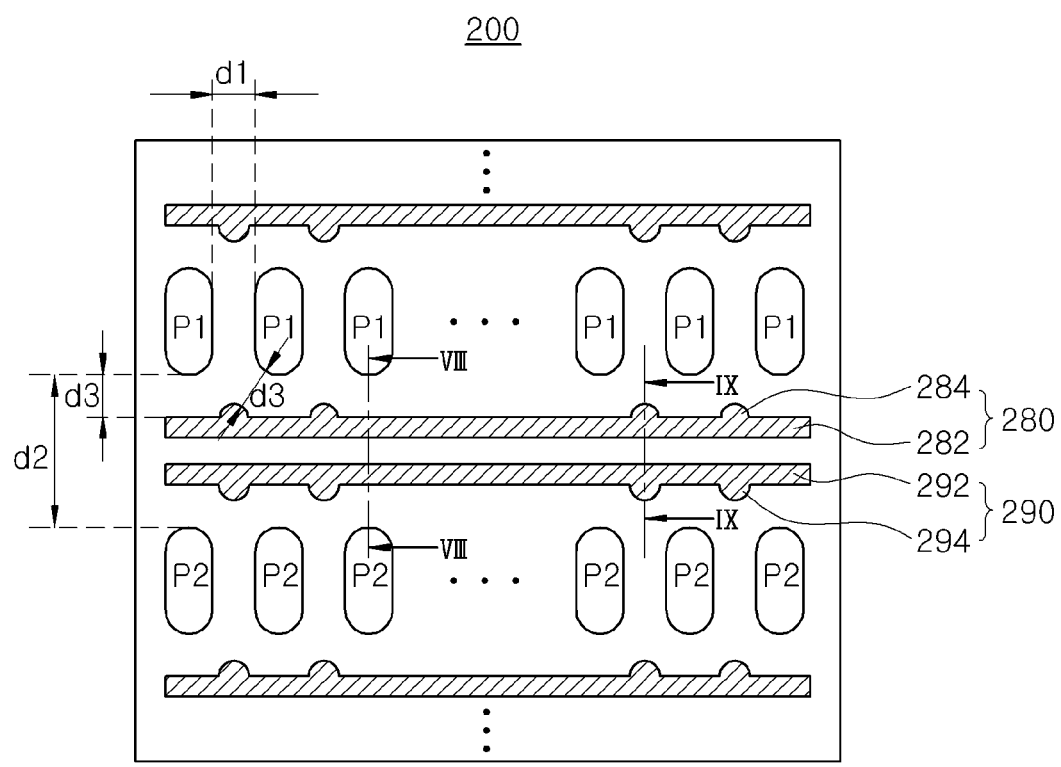
FIG. 7 is a schematic plane view of an electroluminescent display device according to a second embodiment of the present invention.

FIG. 7 is a schematic plane view of an electroluminescent display device according to a second embodiment of the present invention. As shown in FIG. 7, in an electroluminescent display device 200, a plurality of first pixels P1, a plurality of second pixels P2, a first groove 280 and a second groove 290 are arranged. The first pixels P1 are arranged in a first row along a first direction (e.g., horizontal direction), and the second pixels P2 are arranged in a second row in the same direction. The second pixels P2 are spaced apart from the first pixels P1 in a second direction (e.g., vertical direction) perpendicular to the first direction. The first and second grooves 280 and 290 extend along the first direction and are positioned between the first pixels P1 in the first row and the second pixels P2 in the second row. A pair of the grooves 280 and 290 is positioned between a pair of pixel rows.

Although not shown, a light emitting diode is positioned in each of the first and second pixels P1 and P2. The light emitting diode may include a first electrode, a second electrode facing the first electrode and an emitting layer therebetween. In addition, a driving TFT connected to the light emitting diode is positioned in each of the first and second pixels P1 and P2.

The first groove 280 is positioned between a first horizontal pixel row, where the first pixels P1 are arranged, and a second horizontal pixel row, where the second pixels P2 are arranged, and the second groove 290 is positioned between the first groove 280 and the second horizontal pixel row.

The first groove 280 includes a first portion 282 extending in the first direction and second portions 284 bulging towards space between adjacent first pixels P1. The second portions 284 may be bumps extending from the first groove 280. The second groove 290 includes a third portion 292 extending in the first direction and fourth portions 294 bulging toward space between adjacent second pixels P2. Accordingly, each of the first groove 280 and the second groove 290 has a first width (along a vertical direction) in a space between adjacent first pixels P1 (or adjacent second pixel P2), and the each of the first groove 280 and the second groove 290 has a second width in gaps between the first and second pixels P1 and P2. In other words, each of the first groove 280 and the second groove 290 has a different width along the length of the first and second grooves 280 and 290. The first groove 280 and the second portions 284 may be collectively referred to herein as "indents." In other words, the first groove 280 is positioned at a side of the first pixels P1 and includes the first portion 282 extending along the first direction and the second portions 284 bulging from the first portion 282. The second groove 290 is positioned between the first groove 280 and a side of the second pixels P2 and includes the third portion 292 extending along the first direction and the fourth portions 294 bulging from the third portion 292.

Each of the first and third portions 282 and 292 may has a linear bar shape and extend along a direction of the first and second horizontal pixel rows, i.e., the first direction. The second portion 284 protrudes from the first portion 282 toward the first pixel P1 (the first horizontal pixel row), and the fourth portion 294 protrudes from the third portion 292 toward the second pixel P2 (the second horizontal pixel row). The second and fourth portions 284 and 294 having semi-circular shapes are shown. However, there is no limitation in their shape. Each of the second portions 284 bulge into a gap between adjacent first pixels P1. Each of the fourth portions 294 bulge into a gap between adjacent second pixels P2.

Two of the adjacent first pixels P1 and two of the adjacent second pixels P2 are spaced apart from each other by a first edge distance d1, and the first pixel P1 and the second pixel P2 are spaced apart from each other by a second edge distance d2 that is greater than the first edge distance d1. The first and second grooves 280 and 290 are respectively spaced apart from the first and second pixels P1 and P2 by a third edge distance d3 substantially equal to the first edge distance d1.

The first and third portions 282 and 292 have the third edge distance d3 from the end of the first pixel P1 and the end of the second pixel P2, respectively, and the second and fourth portions 284 and 294 have the third edge distance d3 from the corner of the first pixel P1 and the corner of the second pixel P2, respectively.

In the electroluminescent display device 200, each of the first and second pixels P1 and P2 has a round shape at a vertical end. When the first groove 280 includes the first portion 282 without the second portion 284, the edge distance between the first groove 280 and the end of the first pixel P1 is different from the edge distance between the first groove 280 and the corner of the first pixel P1. Accordingly, the solvent concentration in the air at the end and the corner of the first pixel P1 becomes different such that there may be a thickness deviation of the emitting layer at the end and the corner of the first pixel P1. In addition, when the second groove 290 includes the third portion 292 without the fourth portion 294, the edge distance between the second groove 290 and the end of the second pixel P2 is different from the edge distance between the second groove 290 and the corner of the second pixel P2 such that there may be a thickness deviation of the emitting layer at the end and the corner of the second pixel P2.

However, in the electroluminescent display device 200 of FIG. 7, the first and second grooves 280 and 290 respectively include the second portions 284 and the fourth portions 294 such that the above problem is prevented. That is, since the edge distance between the end of the first pixel P1 and the first portion 282 of the first groove 280 is substantially equal to the edge distance between the corner of the first pixel P1 and the second portion 284 of the first groove 280, the emitting layer may have a thickness uniformity at the end and the corner of the first pixel P1. In addition, since the edge distance between the end of the second pixel P2 and the third portion 292 of the second groove 290 is substantially equal to the edge distance between the corner of the second pixel P2 and the fourth portion 294 of the second groove 290, the emitting layer may have a thickness uniformity at the end and the corner of the second pixel P2.

Moreover, since the edge distance between adjacent first pixels P1 and the edge distance between adjacent second pixels P2 are substantially equal to the third edge distance d3, which is an edge distance between the end of the first pixel P1 (second pixel P2) and the first portion 282 (third portion 292) and an edge distance between the corner of the first pixel P1 (second pixel P2) and the second portion 284 (fourth portion 294), the emitting layer in the first and second pixels P1 and P2 has a thickness uniformity regardless of the directions.

Further, a width of the second portion 284 may be smaller than an edge distance between adjacent first pixels P1, and a width of the fourth portion 294 may be smaller than an edge distance between adjacent second pixels P2. Accordingly, the solvent in the second and fourth portions 284 and 294 does not affect the evaporation condition at the end (central end) of the first and second pixels P1 and P2.

Figure 8:
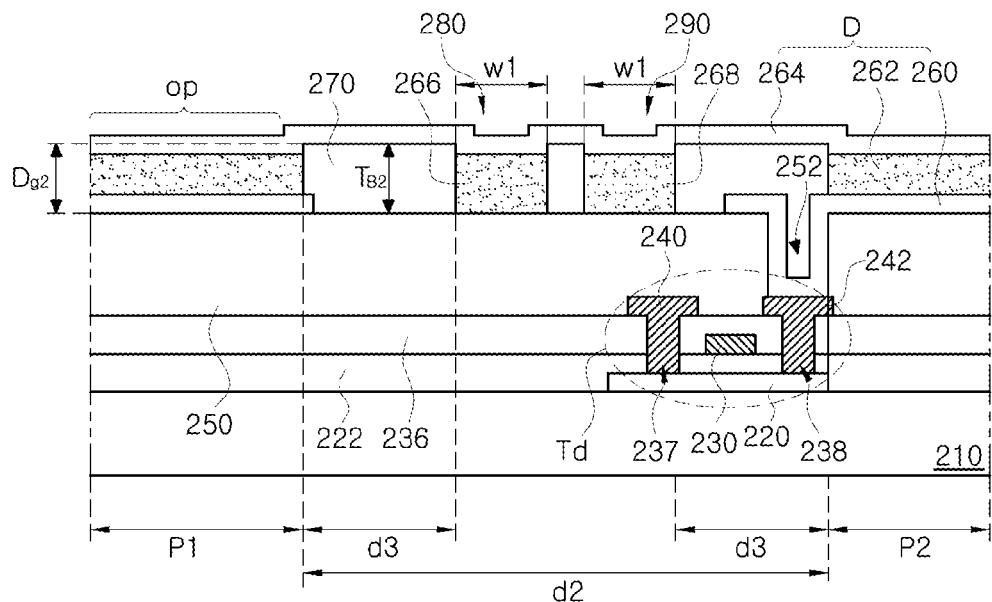
FIG. 8 is a cross-sectional view of electroluminescent display device taken along the line VIII-VIII of FIG. 7.
Figure 9:
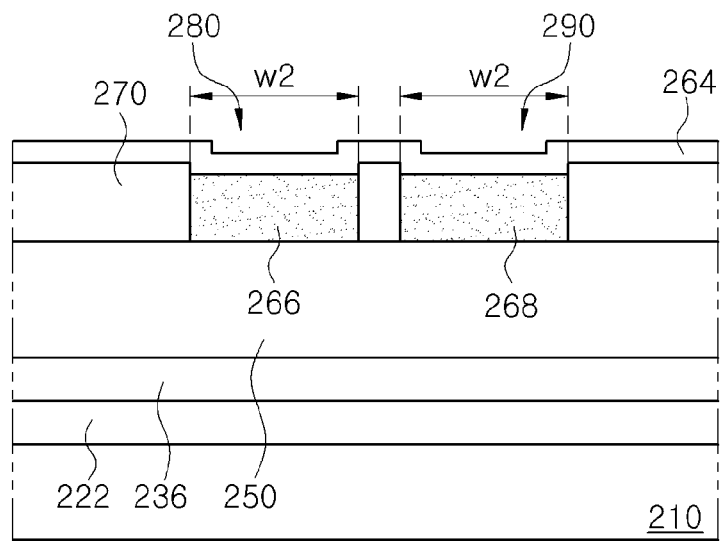
FIG. 9 is a cross-sectional view of the electroluminescent display device taken along the line IX-IX of FIG. 7.

FIG. 8 is a cross-sectional view taken along the line VIII-VIII of FIG. 7, and FIG. 9 is a cross-sectional view taken along the line IX-IX of FIG. 7. As shown in FIGS. 8 and 9, the electroluminescent display device 200 according to the second embodiment of the present invention includes a substrate 210, where the first pixels P1 adjacent along the first direction and the second pixels P2 adjacent to the first pixel P1 along the second direction are defined, the driving TFT Td on or over the substrate 210, the light emitting diode D connected to the driving TFT Td and the first and second grooves 280 and 290 along the first direction and between the first and second pixels P1 and P2.

The substrate 210 may be a glass substrate or a plastic substrate. A semiconductor layer 220 is formed on the substrate 210. The semiconductor layer 220 may be formed of an oxide semiconductor material or a poly-silicon. A gate insulating layer 222 is formed on the semiconductor layer 220. The gate insulating layer 222 may be formed of an inorganic insulating material such as silicon oxide or silicon nitride. A gate electrode 230, which is formed of a conductive material, e.g., metal, is formed on the gate insulating layer 222 to correspond to a center of the semiconductor layer 220. The gate line GL may extend along the first direction, and the first capacitor electrode may be connected to the gate electrode 230.

An interlayer insulating layer 236, which is formed of an insulating material, is formed on an entire surface of the substrate 210 including the gate electrode 230. The interlayer insulating layer 236 may be formed of an inorganic insulating material, e.g., silicon oxide or silicon nitride, or an organic insulating material, e.g., benzocyclobutene or photo-acryl.

The interlayer insulating layer 236 includes first and second contact holes 237 and 238 exposing both sides of the semiconductor layer 220. The first and second contact holes 237 and 238 are positioned at both sides of the gate electrode 230 to be spaced apart from the gate electrode 230.

A source electrode 240 and a drain electrode 242, which are formed of a conductive material, e.g., metal, are formed on the interlayer insulating layer 236. In addition, the data line DL along the second direction, the power line PL and a second capacitor electrode (not shown) of the storage capacitor Cst may be formed on the interlayer insulating layer 236.

The source electrode 240 and the drain electrode 242 are spaced apart from each other with respect to the gate electrode 230 and respectively contact both sides of the semiconductor layer 220 through the first and second contact holes 237 and 238.

The data line DL crosses the gate line GL to define the first and second pixels P1 and P2, and the power line PL is spaced apart from the data line DL.

The second capacitor electrode may be connected to the source electrode 240 and overlap the first capacitor electrode such that the first capacitor electrode, the second capacitor electrode and the interlayer insulating layer 236 therebetween constitute the storage capacitor Cst.

A passivation layer 250, which includes a drain contact hole 252 exposing the drain electrode 242 of the driving TFT Td, is formed to cover the driving TFT Td.

A first electrode 260, which is connected to the drain electrode 242 of the driving TFT Td through the drain contact hole 252, is separately formed on the passivation layer 250 in each of the first and second pixels P1 and P2. The first electrode 260 may be an anode and may be formed of a conductive material having a relatively high work function. For example, the first electrode 260 may be formed of a transparent conductive material such as indium-tin-oxide (ITO) or indium-zinc-oxide (IZO).

When the electroluminescent display device 200 of the present invention is a top-emission type, a reflection electrode or a reflection layer may be formed under the first electrode 260. For example, the reflection electrode or the reflection layer may be formed of aluminum-palladium-copper (APC) alloy.

A bank layer 270, which covers edges of the first electrode 260, is formed on the passivation layer 250. The bank layer 270 has an opening OP corresponding to each of the first and second pixels P1 and P2 and the first and second grooves 280 and 290 between the first pixel P1 and the second pixel P2.

The bank layer 270 surrounds each of the first and second pixels P1 and P2, and an area of each of the first and second pixels P1 and P2 may correspond to an area of the opening OP or an area of the emitting layer 262 in the opening OP.

A center of the first electrode 260 is exposed through the opening OP, and the passivation layer 250 is exposed through the first and second grooves 280 and 290.

The first groove 280 includes the first portion 282 corresponding to the first horizontal pixel row and the second portion 284 corresponding to a space between adjacent first pixels P1. The second groove 290 includes the third portion 292 corresponding to the second horizontal pixel row and the fourth portion 294 corresponding to a space between adjacent second pixels P2.

The first and third portions 282 and 292 have the third edge distance d3 from the end of the first pixel P1 and the end of the second pixel P2, respectively, and the second and fourth portions 284 and 294 have the third edge distance d3 from the corner of the first pixel P1 and the corner of the second pixel P2, respectively.

Each of the first and second grooves 280 and 290 has a depth $H_{g2}$ being substantially equal to a thickness $T_{B2}$ of the bank layer 270. Alternatively, the first and second grooves 280 and 290 may be formed by removing a part of the bank layer 270 such that the depth of the first and second grooves 280 and 290 may be smaller than the thickness of the bank layer 270. In addition, the first and second grooves 280 and 290 may be formed by removing the bank layer 270 and partially or completely removing the passivation layer 250 such that the depth of the first and second grooves 280 and 290 may be greater than the thickness of the bank layer 270.

An emitting layer 262 is formed on the first electrode 260. The emitting layer 262 may be formed by a solution process using a liquid phase emitting material. Namely, an emitting material solution with a solvent is coated and dried such that the emitting layer 262 is formed. For example, the solution process may be an inkjet coating process, a slit coating process, a spin coating process, a printing process or a drop coating process, but it is not limited thereto.

The emitting material layer may include an inorganic emitting material, e.g., a quantum dot, or an organic emitting material. Namely, the electroluminescent display device 200 of the present invention may be an organic light emitting display device (OLED) or a quantum dot light emitting display device (QLED). The emitting material solution is coated in the first and second grooves 280 and 290 such that first and second auxiliary material patterns 1 and 268 are respectively formed in the first and second grooves 280 and 290. Alternatively, when the solvent, which is included in the emitting material solution for the emitting material layer, is coated in the first and second grooves 280 and 290, there is no layer in the first and second grooves 280 and 290 such that the passivation layer 250 may be exposed through the first and second grooves 280 and 290 after the emitting material layer is formed.

In the electroluminescent display device 200, the solvent is added into the first and second grooves 280 and 290 positioned between the first and second pixels P1 and P2. The first and second pixels P1 and P2 are separated by the second edge distance d2 greater than the first edge distance d1 between adjacent pixels P1/P2 of the same line. When the solvent in the grooves 280, 290 evaporate, the solvent concentration in the surrounding air around the first and second pixels P1 and P2 is uniformed regardless of the directions.

In addition, since the first and second grooves 280 and 290 respectively include the second and fourth portions 284 and 294 corresponding to a space between adjacent first pixels P1 and a space between adjacent second pixels P2, respectively, the thickness deviation of the emitting layer 262 at the end and the corner of the first and second pixels P1 and P2 is prevented.

As a result, the thickness non-uniformity problem of the emitting layer 262, which results from a difference in an edge distance between horizontally adjacent pixels and an edge distance between vertically adjacent pixels and a round shape of the first and second pixels P1 and P2, is prevented or minimized.

A second electrode 264 is formed over the substrate 210 including the emitting layer 262 and the first and second auxiliary material patterns 266 and 268. The second electrode 264 may be positioned at an entire surface of the display area. The second electrode 264 may be a cathode and may be formed of a conductive material having a relatively low work function. For example, the second electrode 264 may be formed of aluminum (Al), magnesium (Mg) or Al—Mg alloy.

In the top-emission type electroluminescent display device 200, the second electrode 264 may be thin such that the light from the emitting layer 262 may be transmitted through the second electrode 264. On the other hand, in the bottom-emission type electroluminescent display device 200, the second electrode 264 may serve as a reflection electrode.

The second electrode 264 contacts the emitting layer 262 in each of the first and second pixels P1 and P2 and the first and second auxiliary material patterns 266 and 268 in the first and second grooves 280 and 290 between the first and second pixels P1 and P2. In addition, the second electrode 264 between adjacent first pixels P1 and between adjacent second pixels P2 may contact the bank layer 270.

From the substrate 210, the second electrode 264 has a first height in each of the first and second pixels P1 and P2 and a second height, which is substantially equal to the first height, in the first and second grooves 280 and 290. In addition, from the substrate 210, the second electrode 264 has a third height, which is greater than the first height, in a portion between adjacent first pixels P1 and/or between adjacent second pixels P2.

The second electrode 264 in the first and second grooves 280 and 290 contacts the first and second auxiliary material patterns 266 and 268. However, since the first and second auxiliary material patterns 266 and 268 do not contact the first electrode 260, there is no emission from the first and second auxiliary material patterns 266 and 268 in the first and second grooves 280 and 290.

The first electrode 260, the second electrode 264 facing the first electrode 260 and the emitting layer 262 therebetween constitute the light emitting diode D.

Although not shown, an encapsulation film or an encapsulation substrate may be formed on or over the light emitting diode D to prevent penetration of moisture into the light emitting diode D and protect the light emitting diode D. In addition, a polarization plate may be disposed or attached on the encapsulation film to prevent or minimize an ambient light reflection. For example, the polarization plate may be a circular polarization plate.

In the electroluminescent display device 200 of the present invention, since the emitting layer 262 is formed by the solution process, the fabrication process is simplified and a large-size display device is provided.

In addition, since the solvent or the emitting material solution is coated in the first groove 280, which includes the first portion 282 of a bar shape and the second portion 284 protruding from the first portion 282, and the second groove 290, which includes the third portion 292 of a bar shape and the fourth portion 294 protruding from the third portion 292, between the first and second pixels P1 and P2, which are spaced apart from each other by a relatively large edge distance, the thickness non-uniformity problem of the emitting layer 262 resulting from the solution process is prevented or minimized. Accordingly, the decrease problem of the display quality and the lifetime by the thickness non-uniformity of the emitting layer 262 is prevented or minimized.

Figure 10:
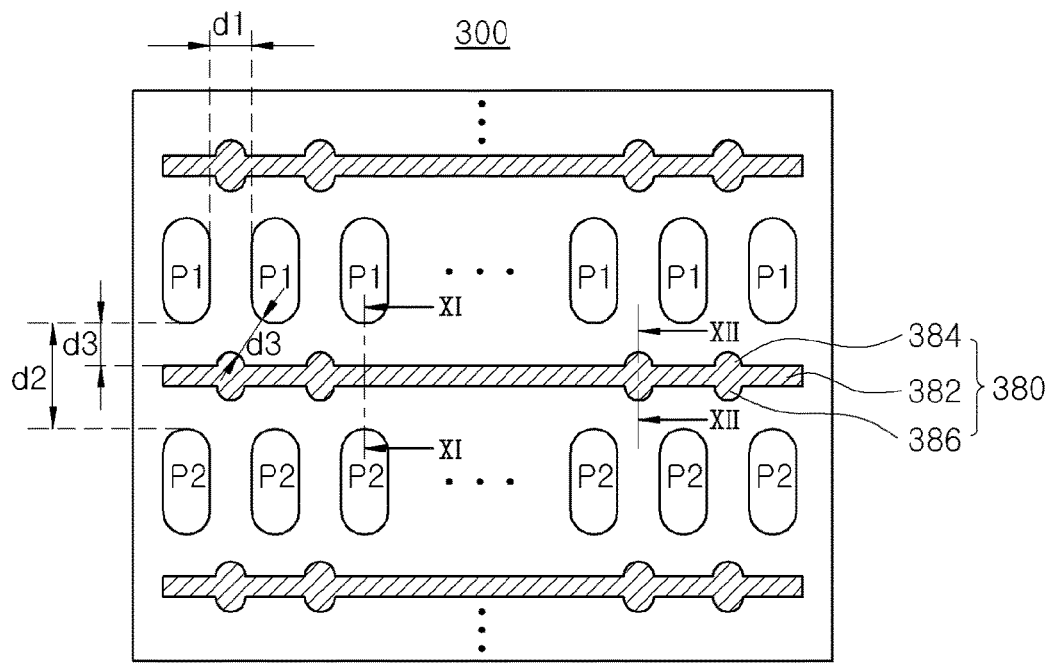
FIG. 10 is a schematic plane view of an electroluminescent display device according to a third embodiment of the present invention.

FIG. 10 is a schematic plane view of an electroluminescent display device according to a third embodiment of the present invention. As shown in FIG. 10, in an electroluminescent display device 300, a plurality of first pixels P1, a plurality of second pixels P2 and a groove 380 are arranged. The first pixels P1 are arranged in a first row along a first direction (e.g., horizontal direction), and the second pixels P2 are arranged in a second row. The second pixels P2 are spaced apart from the first pixels P1 in a second direction (e.g., vertical direction) perpendicular to the first direction. The groove 380 extends along the first direction and is positioned between the first pixels P1 in the first row and the second pixels P2 in the second row.

Although not shown, a light emitting diode is positioned in each of the first and second pixels P1 and P2. The light emitting diode may include a first electrode, a second electrode facing the first electrode and an emitting layer therebetween. In addition, a driving TFT connected to the light emitting diode is positioned in each of the first and second pixels P1 and P2.

The groove 380 is positioned between a first horizontal pixel row, where the first pixels P1 are arranged, and a second horizontal pixel row, where the second pixels P2 are arranged. The groove 380 includes a first portion 382 placed between the first and second pixels P1 and P2 and extending in the first direction, second portions 384 bulging towards space between adjacent first pixels P1, and third portions 386 bulging towards space between adjacent second pixels P2. Accordingly, the groove 380 has a first width (along a vertical direction) in a space between adjacent first pixels P1 (or adjacent second pixel P2), and the groove 380 has a second width in gaps between the first and second pixels P1 and P2. In other words, the groove 380 has a different width along the length of the groove 380. The groove 380, the second portions 384 and the third portions 386 may be collectively be referred to as "indents."

The first portion 382 may has a linear bar shape. The second portions 384 protrude from the first portion 382 toward the first pixel P1 (the first horizontal pixel row), and the third portions 386 protrude from the first portion 382 toward the second pixel P2 (the second horizontal pixel row). Although FIG. 10 shows the first portion 382 having a bar shape and the second and third portions 384 and 386 having semi-circular shapes, this is merely for illustration.

Two of the adjacent first pixels P1 and two of the adjacent second pixels P2 are spaced apart from each other by a first edge distance d1, and the first pixel P1 and the second pixel P2 are spaced apart from each other by a second edge distance d2 greater than the first edge distance d1. The groove 380 is spaced apart from the first and second pixels P1 and P2 by a third edge distance d3 substantially equal to the first edge distance d1. The first portion 382 has the third edge distance d3 from the end of the first pixel P1 and the end of the second pixel P2, and the second and third portions 384 and 386 have the third edge distance d3 from the corner of the first pixel P1 and the corner of the second pixel P2, respectively. Accordingly, in the electroluminescent display device 300 including the first and second pixels P1 and P2, which has a rounded-end shape, the emitting layer has a uniform thickness at the end and the corner of the first and second pixels P1 and P2.

Moreover, since the edge distance between adjacent first pixels P1 and the edge distance between adjacent second pixels P2 are substantially equal to the third edge distance d3, which is an edge distance between the end of the first pixel P1 (second pixel P2) and the first portion 382 and an edge distance between the corner of the first pixel P1 (second pixel P2) and the second portion 384 (third portion 386), the emitting layer in the first and second pixels P1 and P2 has a thickness uniformity regardless of the directions.

Further, a width of the second portion 384 may be smaller than an edge distance between adjacent first pixels P1, and a width of the third portion 386 may be smaller than an edge distance between adjacent second pixels P2. Accordingly, the solvent in the second and third portions 384 and 386 does not affect the evaporation condition at the end (central end) of the first and second pixels P1 and P2.

Figure 11:
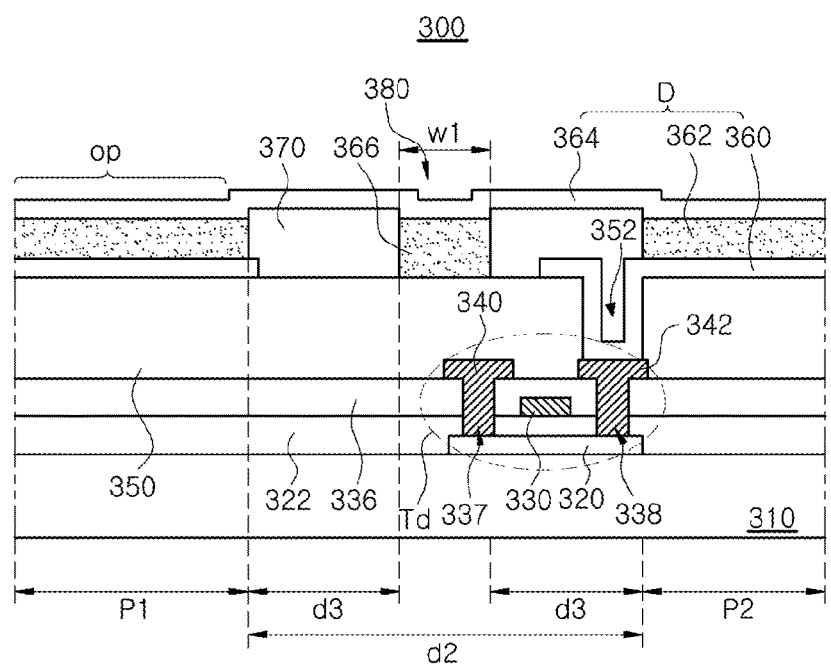
FIG. 11 is a cross-sectional view of the electroluminescent display device taken along the line XI-XI of FIG. 10.
Figure 12:
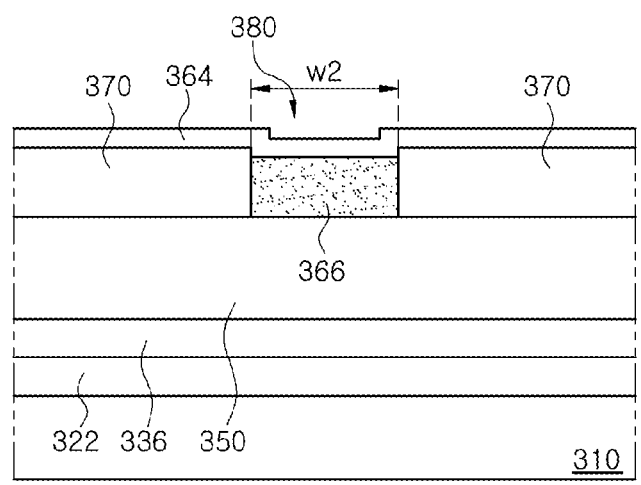
FIG. 12 is a cross-sectional view of the electroluminescent display device taken along the line XII-XII of FIG. 10.

FIG. 11 is a cross-sectional view taken along the line XI-XI of FIG. 10, and FIG. 12 is a cross-sectional view taken along the line XII-XII of FIG. 10. As shown in FIGS. 11 and 12, the electroluminescent display device 300 according to the third embodiment of the present invention includes a substrate 310, where the first pixels P1 adjacent along the first direction and the second pixels P2 adjacent to the first pixel P1 along the second direction are defined, the driving TFT Td on or over the substrate 310, the light emitting diode D connected to the driving TFT Td and the groove 380 along the first direction and between the first and second pixels P1 and P2.

The gate line GL and the data line DL cross each other to define the first and second pixels P1 and P2, and the driving TFT Td is connected to the switching TFT Ts. In addition, the storage capacitor Cst may be formed in each of the first and second pixels P1 and P2. The substrate 310 may be a glass substrate or a plastic substrate. A semiconductor layer 320 is formed on the substrate 310. The semiconductor layer 320 may be formed of an oxide semiconductor material or a poly-silicon. A gate insulating layer 322 is formed on the semiconductor layer 320. The gate insulating layer 322 may be formed of an inorganic insulating material such as silicon oxide or silicon nitride.

A gate electrode 330, which is formed of a conductive material, e.g., metal, is formed on the gate insulating layer 322 to correspond to a center of the semiconductor layer 320. The gate line GL may extend along the first direction, and the first capacitor electrode may be connected to the gate electrode 330.

An interlayer insulating layer 336, which is formed of an insulating material, is formed on an entire surface of the substrate 310 including the gate electrode 330. The interlayer insulating layer 336 may be formed of an inorganic insulating material, e.g., silicon oxide or silicon nitride, or an organic insulating material, e.g., benzocyclobutene or photo-acryl.

The interlayer insulating layer 336 includes first and second contact holes 337 and 338 exposing both sides of the semiconductor layer 320. The first and second contact holes 337 and 338 are positioned at both sides of the gate electrode 330 to be spaced apart from the gate electrode 330.

A source electrode 340 and a drain electrode 342, which are formed of a conductive material, e.g., metal, are formed on the interlayer insulating layer 336. In addition, the data line DL along the second direction, the power line PL and a second capacitor electrode (not shown) of the storage capacitor Cst may be formed on the interlayer insulating layer 336.

The source electrode 340 and the drain electrode 342 are spaced apart from each other with respect to the gate electrode 330 and respectively contact both sides of the semiconductor layer 320 through the first and second contact holes 337 and 338.

The data line DL crosses the gate line GL to define the first and second pixels P1 and P2, and the power line PL is spaced apart from the data line DL.

The second capacitor electrode may be connected to the source electrode 340 and overlap the first capacitor electrode such that the first capacitor electrode, the second capacitor electrode and the interlayer insulating layer 336 therebetween constitute the storage capacitor Cst.

A passivation layer 350, which includes a drain contact hole 352 exposing the drain electrode 342 of the driving TFT Td, is formed to cover the driving TFT Td.

A first electrode 360, which is connected to the drain electrode 342 of the driving TFT Td through the drain contact hole 352, is separately formed on the passivation layer 350 in each of the first and second pixels P1 and P2. The first electrode 360 may be an anode and may be formed of a conductive material having a relatively high work function. For example, the first electrode 360 may be formed of a transparent conductive material such as indium-tin-oxide (ITO) or indium-zinc-oxide (IZO).

When the electroluminescent display device 300 of the present invention is a top-emission type, a reflection electrode or a reflection layer may be formed under the first electrode 360. For example, the reflection electrode or the reflection layer may be formed of aluminum-palladium-copper (APC) alloy.

A bank layer 370, which covers edges of the first electrode 360, is formed on the passivation layer 350. The bank layer 370 has an opening OP corresponding to each of the first and second pixels P1 and P2 and the groove 380 between the first pixel P1 and the second pixel P2.

The bank layer 370 surrounds each of the first and second pixels P1 and P2, and an area of each of the first and second pixels P1 and P2 may correspond to an area of the opening OP or an area of the emitting layer 362 in the opening OP.

A center of the first electrode 360 is exposed through the opening OP, and the passivation layer 350 is exposed through the groove 380.

The groove 380 includes the first portion 382 between the first and second pixels P1 and P2, the second portion 384 corresponding to a space between adjacent first pixels P1 and the third portion 386 corresponding to a space between adjacent second pixels P2.

The first portion 382 has the third edge distance d3 from the end of the first pixel P1 and the end of the second pixel P2, and the second and third portions 384 and 386 have the third edge distance d3 from the corner of the first pixel P1 and the corner of the second pixel P2, respectively.

The groove 380 has a depth being substantially equal to a thickness of the bank layer 370. Alternatively, the groove 380 may be formed by removing a part of the bank layer 370 such that the depth of the groove 380 may be smaller than the thickness of the bank layer 370. In addition, the groove 380 may be formed by removing the bank layer 370 and partially or completely removing the passivation layer 350 such that the depth of the groove 380 may be greater than the thickness of the bank layer 370.

An emitting layer 362 is formed on the first electrode 360. The emitting layer 362 may be formed by a solution process using a liquid phase emitting material. Namely, an emitting material solution with a solvent is coated and dried such that the emitting layer 362 is formed. For example, the solution process may be an inkjet coating process, a slit coating process, a spin coating process, a printing process or a drop coating process, but it is not limited thereto.

The emitting layer 362 may have a single-layered structure of an emitting material layer. Alternatively, to improve emitting efficiency, the emitting layer 362 may further include a hole injection layer and a hole transporting layer, which are sequentially stacked between the first electrode 360 and the emitting material layer, and an electron transporting layer and an electron injection layer sequentially between the emitting material layer and the second electrode 364.

The emitting material layer may include an inorganic emitting material, e.g., a quantum dot, or an organic emitting material. Namely, the electroluminescent display device 300 of the present invention may be an organic light emitting display device (OLED) or a quantum dot light emitting display device (QLED).

The emitting material solution is coated in the groove 380 such that an auxiliary material pattern 366 is formed in the groove 380.

Alternatively, when the solvent, which is included in the emitting material solution for the emitting material layer, is coated in the groove 380, there is no layer in the groove 380 such that the passivation layer 350 may be exposed through the groove 380 after the emitting material layer is formed.

In the electroluminescent display device 300, the solvent is placed in the groove 380 positioned between the first and second pixels P1 and P2. The first and second pixels P1 and P2 are adjacent to each other by the second edge distance d2 greater than the first edge distance d1 between adjacent pixels P1/P2 in the same row. Therefore, when the solvent in the groove 380 evaporates, the solvent concentration in the surrounding air of the first and second pixels P1 and P2 remains uniform regardless of the directions. In addition, since the groove 380 includes the second and third portions 384 and 386, the thickness deviation of the emitting layer 362 at the end and the corner of the first and second pixels P1 and P2 is reduced or prevented. As a result, the thickness non-uniformity problem of the emitting layer 362, which results from a difference in an edge distance between horizontally adjacent pixels and an between vertically adjacent pixels and a round shape of the first and second pixels P1 and P2, is prevented or minimized.

A second electrode 364 is formed over the substrate 310 including the emitting layer 362 and auxiliary material pattern 366. The second electrode 364 may be positioned at an entire surface of the display area. The second electrode 364 may be a cathode and may be formed of a conductive material having a relatively low work function. For example, the second electrode 364 may be formed of aluminum (Al), magnesium (Mg) or Al—Mg alloy.

In the top-emission type electroluminescent display device 300, the second electrode 364 may have a thin thickness such that the light from the emitting layer 362 may be transmitted through the second electrode 364. On the other hand, in the bottom-emission type electroluminescent display device 300, the second electrode 364 may serve as a reflection electrode.

The second electrode 364 contacts the emitting layer 362 in each of the first and second pixels P1 and P2 and the auxiliary material pattern 366 in the groove 380 between the first and second pixels P1 and P2. In addition, the second electrode 364 between adjacent first pixels P1 and between adjacent second pixels P2 may contact the bank layer 370.

From the substrate 310, the second electrode 364 has a first height in each of the first and second pixels P1 and P2 and a second height, which is substantially equal to the first height, in the groove 380. In addition, from the substrate 310, the second electrode 364 has a third height, which is greater than the first height, in a portion between adjacent first pixels P1 and/or between adjacent second pixels P2.

The second electrode 364 in the groove 380 contacts the auxiliary material pattern 366. However, since the auxiliary material pattern 366 does not contact the first electrode 360, there is no emission from the auxiliary material pattern 366 in the groove 380.

The first electrode 360, the second electrode 364 facing the first electrode 360 and the emitting layer 362 therebetween constitute the light emitting diode D.

Although not shown, an encapsulation film or an encapsulation substrate may be formed on or over the light emitting diode D to prevent penetration of moisture into the light emitting diode D and protect the light emitting diode D. In addition, a polarization plate may be disposed or attached on the encapsulation film to prevent or minimize an ambient light reflection. For example, the polarization plate may be a circular polarization plate.

In the electroluminescent display device 300 of the present invention, since the emitting layer 362 is formed by the solution process, the fabrication process is simplified and a large-size display device is provided.

In addition, since the solvent or the emitting material solution is coated in the groove 380, which includes the first portion 382 of a bar shape and the second and third portions 384 and 386 respectively protruding from the first portion 382, between the first and second pixels P1 and P2, which are spaced apart from each other by a relatively large edge distance, the thickness non-uniformity problem of the emitting layer 362 resulting from the solution process is prevented or minimized. Accordingly, the decrease problem of the display quality and the lifetime by the thickness non-uniformity of the emitting layer 362 is prevented or minimized.

Figure 13:
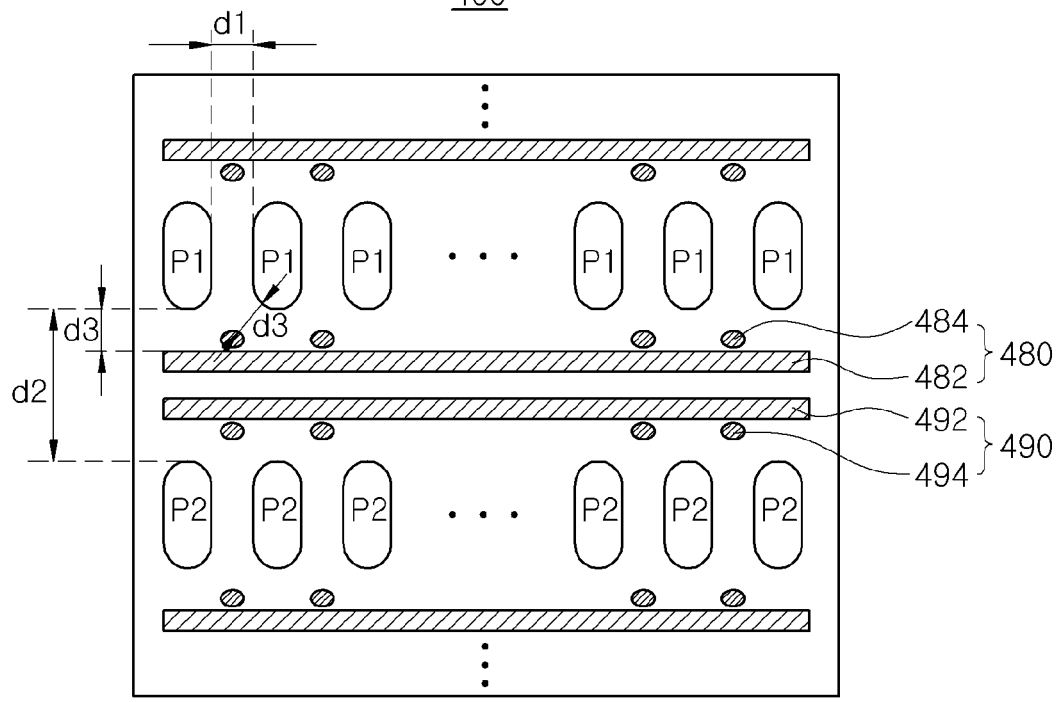
FIG. 13 is a schematic plane view of an electroluminescent display device according to a fourth embodiment of the present invention.

FIG. 13 is a schematic plane view of an electroluminescent display device according to a fourth embodiment of the present invention. As shown in FIG. 13, in an electroluminescent display device 400, a plurality of first pixels P1, a plurality of second pixels P2, a first indent 480 and a second indent 490 are arranged. The first pixels P1 are arranged in a first row along a first direction, and the second pixels P2 are arranged in a second row. The second pixels P2 are spaced apart from the first pixels P1 in a second direction being perpendicular to the first direction. The first and second indents 480 and 490 extend along the first direction and are positioned between the first pixels P1 in the first row and the second pixels P2 in the second row. Namely, a pair of the grooves 480 and 490 is positioned between a pair of pixel rows.

The first indent 480 is positioned between a first horizontal pixel row, where the first pixels P1 are arranged, and a second horizontal pixel row, where the second pixels P2 are arranged, and the second indent 490 is positioned between the first indent 480 and the second horizontal pixel row.

The first indent 480 includes a groove 482 extending in the first direction. The first indent 480 also includes holes 484 formed separately from the groove 482 and also holds emitting material solution in conjunction with the groove 482. Each of the holes 484 are placed between the groove 482 and a gap of adjacent first pixels P1. The second indent 490 includes a second groove 492 extending in the first direction. The second indent 490 also includes holes 494 formed between the second groove 492 and gaps between the adjacent second pixels P2.

Each of the grooves 482 and 492 may has a linear bar shape and extend along a direction of the first and second horizontal pixel rows, i.e., the first direction. However, there is no limitation in their shape.

Two of the adjacent first pixels P1 and two of the adjacent second pixels P2 are spaced apart from each other by a first edge distance d1, and the first pixel P1 and the second pixel P2 are spaced apart from each other by a second edge distance d2 greater than the first edge distance d1. The first and second grooves 482 and 492 are respectively spaced apart from the first and second pixels P1 and P2 by a third edge distance d3 substantially equal to the first edge distance d1.

The first and second indents 480 and 490 have the third edge distance d3 from the end of the first pixel P1 and the end of the second pixel P2, respectively, and the holes 484 and 494 have the third edge distance d3 from the corner of the first pixel P1 and the corner of the second pixel P2, respectively. Accordingly, in the electroluminescent display device 400 including the first and second pixels P1 and P2, which has a rounded-end shape, the emitting layer has a uniform thickness at the end and the corner of the first and second pixels P1 and P2.

Moreover, since the first edge distance between adjacent first pixels P1 and between adjacent second pixels P2 is substantially equal to the third edge distance d3, which is an edge distance between the end of the first pixel P1 (second pixel P2) and the first groove 482 (the second groove 492) and an edge distance between the corner of the first pixel P1 (second pixel P2) and the second portion 484 (fourth portion 494), the emitting layer in the first and second pixels P1 and P2 has a thickness uniformity regardless of the directions.

Further, a width of the second portion 484 may be smaller than an edge distance between adjacent first pixels P1, and a width of the holes 494 may be smaller than an edge distance between adjacent second pixels P2. Accordingly, the solvent in the holes 484 and 494 does not affect the evaporation condition at the end (central end) of the first and second pixels P1 and P2.

Figure 14:
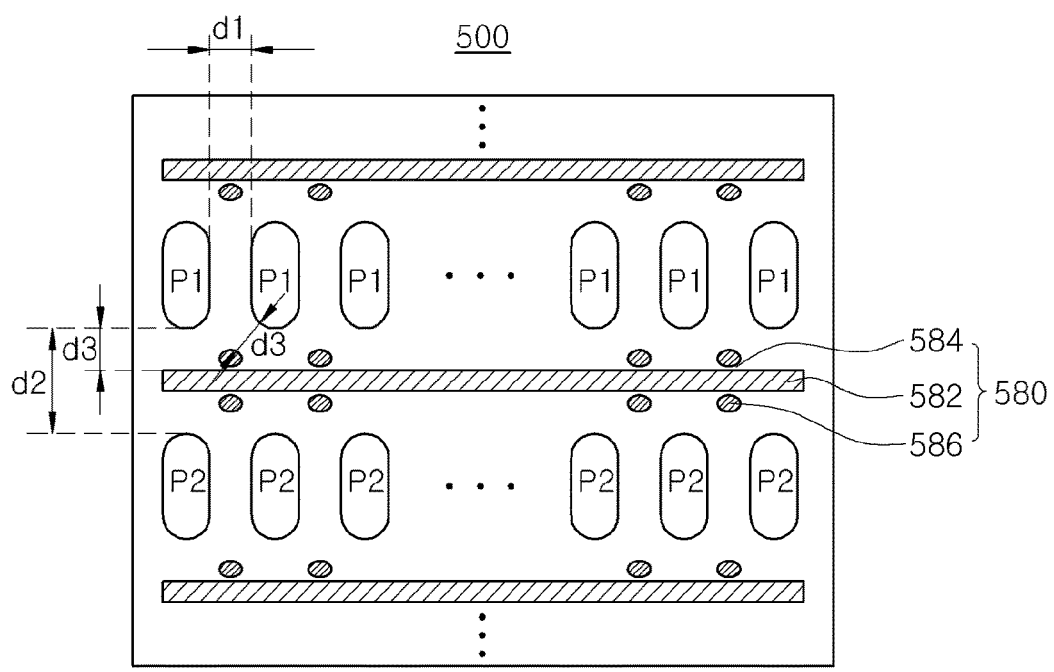
FIG. 14 is a schematic plane view of an electroluminescent display device according to a fifth embodiment of the present invention.

FIG. 14 is a schematic plane view of an electroluminescent display device according to a fifth embodiment of the present invention. As shown in FIG. 14, in an electroluminescent display device 500, a plurality of first pixels P1, a plurality of second pixels P2 and an indent 580 are arranged. The first pixels P1 are arranged in a first row along a first direction, and the second pixels P2 are arranged in a second row. The second pixels P2 are spaced apart from the first pixels P1 in a second direction being perpendicular to the first direction. The groove 582 of the indent 580 extends along the first direction and is positioned between the first pixels P1 in the first row and the second pixels P2 in the second row.

Although not shown, a light emitting diode is positioned in each of the first and second pixels P1 and P2. The light emitting diode may include a first electrode, a second electrode facing the first electrode and an emitting layer therebetween. In addition, a driving TFT connected to the light emitting diode is positioned in each of the first and second pixels P1 and P2.

The indent 580 is positioned between a first horizontal pixel row, where the first pixels P1 are arranged, and a second horizontal pixel row, where the second pixels P2 are arranged. The indent 580 includes a groove 582 between the first and second pixels P1 and P2, holes 584 corresponding to a space between adjacent first pixels P1 and holes 586 corresponding to a space between adjacent second pixels P2.

The indent 580 may have a linear bar shape and extend along a direction of the first and second horizontal pixel rows, i.e., the first direction. Holes 584 are spaced apart from the groove 582 toward the first pixel P1 (the first horizontal pixel row), and the third portion 586 is spaced apart from the groove 582 toward the second pixel P2 (the second horizontal pixel row).

Holes 584 may be closer to the groove 582 than the first pixel P1, and holes 586 may be closer to the groove 582 than the second pixel P2.

The groove 582 has a bar shape and the holes 584 and 586 have a semi-circular shape are shown. However, there is no limitation in their shape.

Adjacent two of the first pixels P1 and adjacent two of the second pixels P2 are spaced apart from each other by a first edge distance d1, and the first pixel P1 and the second pixel P2 are spaced apart from each other by a second edge distance d2 being greater than the first edge distance d1. The groove 582 is spaced apart from the first and second pixels P1 and P2 by a third edge distance d3 substantially equal to the first edge distance d1.

The groove 582 has the third edge distance d3 from the end of the first pixel P1 and the end of the second pixel P2, and the holes 584 and 586 have the third edge distance d3 from the corner of the first pixel P1 and the corner of the second pixel P2, respectively. Accordingly, in the electroluminescent display device 500 including the first and second pixels P1 and P2, which has a rounded-end shape, the emitting layer has a uniform thickness at the end and the corner of the first and second pixels P1 and P2.

Moreover, since the edge distance between adjacent first pixels P1 and the edge distance between adjacent second pixels P2 are substantially equal to the third edge distance d3, which is an edge distance between the end of the first pixel P1 (second pixel P2) and the groove 582 and an edge distance between the corner of the first pixel P1 (second pixel P2) and the holes 584, 586, the emitting layer in the first and second pixels P1 and P2 has a thickness uniformity regardless of the directions.

Further, a width of the holes 584 may be smaller than an edge distance between adjacent first pixels P1, and a width of the holes 586 may be smaller than an edge distance between adjacent second pixels P2. Accordingly, the solvent in the holes 584 and 586 does not affect the evaporation condition at the end (central end) of the first and second pixels P1 and P2.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An electroluminescent display device, comprising:
   a first pixel on a substrate;

a second pixel on the substrate, the second pixel separated from the first pixel in a first direction;

a third pixel on the substrate, the third pixel separated from the first pixel in a second direction;

a fourth pixel on the substrate, the fourth pixel separated from the third pixel in the first direction;

a first indent positioned between the first and third pixels and including a first portion extending along the first direction and a second portion corresponding to the first and second pixels;

a second indent between the first indent and third pixel, the second indent including a third portion extending along the first direction and a fourth portion corresponding to the third and fourth pixels; and a light emitting diode in each of the first and second pixels, wherein in the second direction, a length of the second portion is smaller than a length of the first pixel, and wherein an edge distance from the third portion of the second indent to the third and fourth pixels is equal to an edge distance from the fourth portion of the second indent to each of the third and fourth pixels.

2. The electroluminescent display device according to claim 1, wherein the second portion protrudes toward a gap between the first pixel and the second pixel from the first portion.

3. The electroluminescent display device according to claim 1, wherein the second portion is spaced apart from the first portion.

4. The electroluminescent display device according to claim 1, wherein an edge distance from the first portion of the first indent to the first and second pixels is equal to an edge distance from the second portion of the first indent to each of the first and second pixels.

5. The electroluminescent display device according to claim 1, wherein the fourth portion protrudes toward a gap between the third pixel and the fourth pixel from the third portion.

6. The electroluminescent display device according to claim 1, wherein the fourth portion is spaced apart from the third portion.

7. The electroluminescent display device according to claim 1, further comprising:

a thin film transistor between the substrate and the light emitting diode;

an insulating layer covering the thin film transistor and positioned between the thin film transistor and the light emitting diode; and a bank layer on the insulating layer and surrounding the first and second pixels, wherein the light emitting diode includes a first electrode on the insulating layer and in each of the first and second pixels, an emitting layer on the first electrode and a second electrode covering the emitting layer, and wherein the first indent is formed in the bank layer.

8. The electroluminescent display device according to claim 7, further comprising an auxiliary material pattern in the first indent, wherein the auxiliary material pattern contacts the insulating layer and the second electrode.

9. The electroluminescent display device according to claim 7, wherein the second electrode in the first indent contacts the insulating layer.

10. The electroluminescent display device according to claim 7, wherein the first indent has a depth equal to a thickness of the bank layer.

11. The electroluminescent display device according to claim 7, wherein the second electrode has a first height in the first indent from the substrate and a second height in each of the first and second pixels from the substrate, and the first height is smaller than the second height.

12. The electroluminescent display device according to claim 1, wherein a width of the first indent is smaller than a distance between the first and second pixels.

13. An electroluminescent display device, comprising:

a first pixel on a substrate;

a second pixel on the substrate, the second pixel separated from the first pixel in a first direction;

a third pixel on the substrate, the third pixel separated from the first pixel in a second direction; and at least one indent between the first pixel and the third pixel, wherein edge distances from the at least one indent to the first, second and third pixels are same, wherein the indent has a different width along a length of the indent, wherein the at least one indent includes a first indent and a second indent between the first pixel and the third pixel, the first indent closer to the first pixel than the third pixel, the second indent closer to the third pixel than the first pixel, wherein an edge distance between the first indent and the first pixel is same as an edge distance between the second indent and the third pixel.

14. The electroluminescent display device of claim 13, wherein the second pixel separated from the first pixel in the first direction by a first edge distance, the third pixel separated from the first pixel in the second direction by the second edge distance larger than the first edge distance.

15. The electroluminescent display device of claim 14, wherein the second direction is perpendicular to the first direction.

16. The electroluminescent display device of claim 14, wherein the at least one indent comprises a first groove and a second groove, the first groove having a first linear bar portion extending alongside a row of pixels and first bump portions protruding towards gaps between the row of pixels, and the second groove having a second linear bar portion extending parallel to the first linear bar portion and having second bump portions protruding towards gaps between another row of pixels including the third pixel.

17. The electroluminescent display device of claim 16, wherein an edge distance between an edge of the first pixel and a first bump portion nearest to the edge of the first pixel is same as an edge distance between an end of the first pixel and the first linear bar portion, and wherein an edge distance between an edge of the third pixel and a second bump portion nearest to the edge of the third pixel is same as an edge distance between an end of the third pixel and the second linear bar portion.

18. The electroluminescent display device of claim 13, wherein the indent has a first width between the first pixel and the second pixel, and the indent has a second width between the first pixel and the third pixel, the second width narrower than the first width.

19. The electroluminescent display device of claim 13, wherein the edge distances are equal to an edge distance between the first pixel and the second pixel.

20. The electroluminescent display device of claim 13, wherein the first pixel and the second pixel are in a same row of pixels arranged in the first direction, and the third pixel is in a same column of pixels arranged in the second direction.

21. The electroluminescent display device of claim 13, wherein the first indent includes:

a first linear bar portion extending alongside a row of pixels and first holes between the first linear bar portion and the row of pixels, and wherein the second indent includes:

a second linear bar portion extending parallel to the first linear bar portion, and second holes between the second linear bar portion and another row of pixels including the third pixel.

22. The electroluminescent display device of claim 21, wherein an edge distance from an edge of the first pixel to a nearest first hole is same as an edge distance from an end of the first pixel to the first linear bar portion, and an edge distance from an edge of the third pixel to a nearest second hole is same as an edge distance from an end of the third pixel to the second linear bar portion.

* * * * *